United States Patent
Park et al.

(10) Patent No.: US 7,118,810 B2
(45) Date of Patent: Oct. 10, 2006

(54) ORGANIC/POLYMER ELECTROLUMINESCENT DEVICES EMPLOYING SINGLE-ION CONDUCTORS

(75) Inventors: O-Ok Park, Taejon (KR); Tae-Woo Lee, Pusan (KR)

(73) Assignee: Korea Advanced Institute of Science & Technology, Taejon (KR)

( * ) Notice: Subject to any disclaimer, the term of this patent is extended or adjusted under 35 U.S.C. 154(b) by 498 days.

(21) Appl. No.: 09/995,816

(22) Filed: Nov. 27, 2001

(65) Prior Publication Data

US 2002/0037432 A1   Mar. 28, 2002

Related U.S. Application Data

(63) Continuation of application No. PCT/KR01/00535, filed on Mar. 30, 2001.

(30) Foreign Application Priority Data

Mar. 30, 2000 (KR) .................. 10-2000-0016456

(51) Int. Cl.
*H05B 33/12* (2006.01)

(52) U.S. Cl. .................. 428/690; 428/917; 313/504; 313/506

(58) Field of Classification Search .............. 428/690, 428/917; 257/40; 313/503, 504, 506
See application file for complete search history.

(56) References Cited

U.S. PATENT DOCUMENTS

| | | | |
|---|---|---|---|
| 4,769,292 A * | 9/1988 | Tang et al. | 428/690 |
| 5,408,109 A * | 4/1995 | Heeger et al. | 257/40 |
| 5,414,069 A | 5/1995 | Cumming et al. | 528/310 |
| 5,537,000 A | 7/1996 | Alivisatos et al. | 313/506 |
| 5,682,043 A * | 10/1997 | Pei et al. | 257/40 |
| 5,707,745 A * | 1/1998 | Forrest et al. | 428/432 |
| 5,817,431 A | 10/1998 | Shi et al. | 428/690 |
| 5,900,327 A * | 5/1999 | Pei et al. | 428/690 |
| 5,965,281 A * | 10/1999 | Cao | 428/690 |
| 5,994,835 A | 11/1999 | Wilson et al. | 313/504 |
| 6,030,715 A | 2/2000 | Thompson et al. | 428/690 |
| 6,259,201 B1 * | 7/2001 | Lee et al. | 313/504 |
| 6,326,091 B1 * | 12/2001 | Schoo et al. | 428/690 |
| 6,538,263 B1 * | 3/2003 | Park et al. | 257/40 |

FOREIGN PATENT DOCUMENTS

| | | | |
|---|---|---|---|
| EP | WO 97/40648 | * | 10/1997 |
| JP | 10-308277 | | 11/1998 |
| JP | 11-233262 | | 8/1999 |

(Continued)

OTHER PUBLICATIONS

Lee et al., "Use of Ionomer as an electron injecting and hole blocking material for polymer light-emitting diode", Applied Physic Letters, vol. 72, No. 19, pp. 2382-2384.*

(Continued)

*Primary Examiner*—Rena Dye
*Assistant Examiner*—Camie Thompson

(57) ABSTRACT

The present invention relates to electroluminescent devices employing single-ion conductors as the materials for an electron- or hole-injecting layer. Preferred electroluminescent devices employ an electron- or hole-injecting layer made of single-ion conductors in a conventional electroluminescent device which comprises: a transparent substrate; a semitransparent electrode deposited on the transparent substrate; a hole-injecting layer positioned on the semitransparent electrode; an electroluminescent layer made of organic luminescent material, positioned on the hole-injecting layer; an electron-injecting layer positioned on the electroluminescent layer; and, a metal electrode deposited on the electron-injecting layer. The electroluminescent devices of the invention have excellent electroluminescent efficiency and low turn-on voltage, which make possible their application to the development of high efficiency electroluminescent devices.

14 Claims, 1 Drawing Sheet

FOREIGN PATENT DOCUMENTS

WO     WO 01/78464 A1     10/2001

OTHER PUBLICATIONS

Cimrova, et al., *Efficient Blue Light Emitting Devices Based on Rigid-Rod Polyelectrolytes,* Advanced Materials, 8(7):585-588(1996).

Lee, et al., *Use of Ionomer as an Electron Injecting and Hole Blocking Material for Polymer Light-Emitting Diode,* Appl. Phys. Lett., 72(19):2382-2384(1998).

\* cited by examiner

ORGANIC/POLYMER ELECTROLUMINESCENT DEVICES EMPLOYING SINGLE-ION CONDUCTORS

RELATED APPLICATION INFORMATION

This application is a continuation under 35 U.S.C. § 365(c) claiming the benefit of the filing date of PCT application Ser. No. PCT/KR01/00535 designating the United States, filed 30 Mar. 2001 and published in English as WO 01/78464 A1 on 18 Oct. 2001, and which claims the benefit of the earlier filing date of Korean Patent Application No. 2000/16456, filed 30 Mar. 2000. The publication WO 01/78464 A1 is incorporated herein by reference.

BACKGROUND OF THE INVENTION

1. Field of the Invention

The present invention relates to electroluminescent devices employing single-ion conductors, more specifically, to organic/polymer electroluminescent devices employing single-ion conductors as an electron- or hole-injecting layer.

2. Description of the Related Art

Electroluminescent ("EL") devices that emit light by applying an electric field to the device typically comprise an ITO (indium tin oxide) substrate, EL material and two electrodes. To improve the EL efficiency, the device is provided with a hole-injecting layer between the ITO electrode and EL material, an electron-injecting layer between EL material and the counter metal electrode, or both layers. As the EL material that plays a crucial role in the device, organic polymer/inorganic hybrid nanocomposite employing insulating inorganic materials, such as $SiO_2$ and $TiO_2$ that help the transport of electric charges, has been developed and put to the practical use (see: S. A. Carter, Applied Physics Letters, 71:1145, 1997; L. Gozano, Applied Physics Letters, 73:3911, 1998).

In the meantime, studies on the hole- or electron-injecting layer have been actively performed to improve the EL efficiency, mainly by way of inserting ionomers as the electron-injecting layer (see: Hyang-Mok Lee et al., Applied Physics Letters, 72, 2382, 1998). However, it cannot be a basic solution to improve the EL efficiency because the movement of ions is restricted in the ionomers, which naturally limits electron-injection. As an alternative means for efficient electron-injection, an electron-transporting layer rather than the electron-injecting layer, was proposed in the art, which utilizes the materials that well transport electrons and have high affinity to the electrons. Several methods that utilize inorganic nanoparticles, 2-(4-biphenylyl)-5-(4-tert-butylphenyl)-1,3,4-oxadiazole (PBD), or metal chelate complexes have been presented until now (see: U.S. Pat. Nos. 5,537,000; 5,817,431; and 5,994,835). However, these methods have not been realized in practical use due to the low EL efficiency or the difficulties confronted in the thin film deposition process.

Under the circumstances, there are strong reasons for developing and exploring a material that can be used as the hole- or electron-injecting layer to improve the EL efficiency while employing the convenient thin-film deposition process such as a spin-coating method.

SUMMARY OF THE INVENTION

The present inventors made an effort to develop a material that can improve the EL efficiency with convenient thin-film deposition process, and discovered that EL devices employing single-ion conductors as an electron- or hole-injecting layer show a highly improved EL efficiency.

A primary object of the present invention is, therefore, to provide EL devices employing single-ion conductors as an electron- or hole-injecting layer.

BRIEF DESCRIPTION OF THE DRAWINGS

The above, the other objects and features of the invention will become apparent from the following descriptions given in conjunction with the accompanying drawings, in which.

Figure 1:
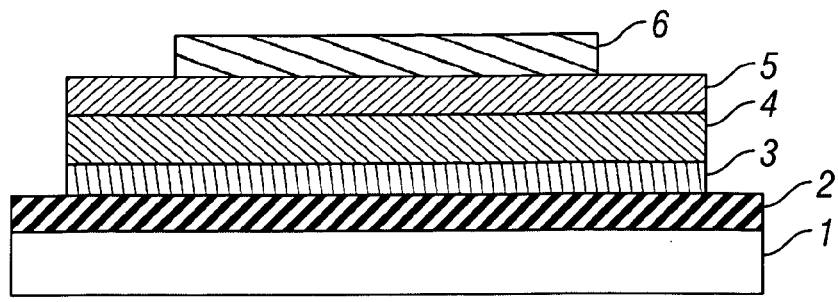
FIG. 1 is a schematic diagram showing a cross-sectional view of an organic/polymer EL device employing single-ion conductors of the present invention.

Explanation of major parts of the drawings:
1: transparent substrate
2: semitransparent electrode
3: hole-injecting layer
4: electroluminescent layer
5: electron-injecting layer
6: metal electrode

DETAILED DESCRIPTION OF THE PREFERRED EMBODIMENT

The organic/polymer EL device of the invention is improved in a sense that it employs electron- or hole-injecting layer made of single-ion conductors in a conventional EL device which comprises: a transparent substrate; a semitransparent electrode deposited on the transparent substrate; a hole-injecting layer positioned on the semitransparent electrode; an emissive layer made of organic luminescent material, positioned on the hole-injecting layer; an electron-injecting layer positioned on the emissive layer; and, a metal electrode deposited on the electron-injecting layer. The transparent substrate includes glass, quartz or PET (polyethylene terephtalate), and the semitransparent electrodes includes ITO (indium tin oxide), PEDOT (polyethylene dioxythiophene) or polyaniline.

The organic EL material includes: emissive conjugated polymers such as poly(para-phenylvinylene), poly (thiophene), poly(para-phenylene), poly(fluorene) or their derivatives; emissive non-conjugated polymers with side chains substituted with emissive functional groups such as anthracene; metal chelate complex of ligand structure such as emissive alumina quinone (Alq3); low molecular-weight emissive organic material (monomers or oligomers) such as rubrene, anthracene, perylene, coumarine 6, Nile red, aromatic diamine, TPD (N,N'-diphenyl-N,N'-bis-(3-methylphenyl)-1,1'-biphenyl-4,4'-diamine), TAZ (3-(4-biphenyl)-4-phenyl-5-(4-tert-butylphenyl)-1,2,4-triazole) or other emissive monomeric or oligomeric material of the derivative of those material; laser dyes such as DCM (dicyanomethylene)-2-methyl-6-(p-dimethylaminostyryl)-4H-pyran), and blends of poly(meta-methylacrylic acid), polystyrene and poly(9-vinylcarbazole) with above-mentioned emissive materials. And, aluminum, magnesium, lithium, calcium, copper, silver, gold, or an alloy thereof is preferably employed for the metal electrode.

As the single-ion conductors, the materials containing ether chains $((-CH_2)_nO-)$ such as polyethylene oxide or polypropylene oxide, and ionic groups such as $SO_3^-$, $COO^-$, $I^-$, or $(NH_3)_4^+$ in the main chains that form ionic bonds with counter ions such as $Na^+Li^+$, $Zn^{2+}$, $Mg^{2+}$, $Eu^{3+}$, $COO^-$, $SO^{3-}$, $I^-$, or $(NH_3)_4^+$ are preferably employed.

In general, single-ion conductors are classified into single-cation conductors (see: general formula (I), general formula (II)) and single-anion conductors (see: general formula (III) and general formula (IV)).

(I)

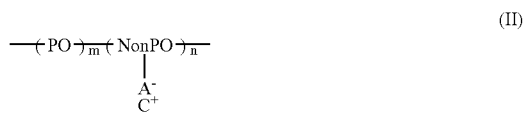
(II)

wherein EO represents ethyleneoxide; NonEO represent non-ethyleneoxide; PO represents propyleneoxide; NonPO represents non-propyleneoxide; $A^-$ represents an anion; $C^+$ represents a cation; m+n=1; and, n represents a real number more than 0 and less than 1.

As shown in the general formula (I) and the general formula (II), single-cation conductors contain ether chains (($-CH_2)_nO-$) such as polyethyleneoxide or polypropyleneoxide in the main chains, and anionic groups such as $SO_3^-$, $COO^-$, or $I^-$ in the main or side chains which form ionic bonds with metal ions such as $Na^+$, $Li^+$, $Zn^{2+}$, $Mg^{2+}$, or $Eu^{3+}$, or other organic ions such as $(NH_3)_4^+$ as the counter ion.

(III)

(IV)

wherein EO represents ethyleneoxide; NonEO represents non-ethyleneoxide; PO represents propyleneoxide; NonPO represents non-propyleneoxide; $A^-$ represents anion; $C^+$ represents cation; m+n=1; and, n represents a real number more than 0 and less than 1.

As shown in general formula (III) and general formula (IV), single-anion conductor contains ether chains (($-CH_2)_nO-$) such as polyethyleneoxide or polypropyleneoxide in the main chains, and cationic group such as $(NH_3)_4^+$ or ($-CH_2-)_nO^+$ in the main or side chains which form ionic bonds with anions such as $SO_3^-$, $COO^-$, or $I^-$ as counter ion.

In the single-ion conductors descried above, the ether chain dissociates counter ions from the ions attached to the main chain and allows the ions to move much more freely. The EL intensity and the EL efficiency can be improved by employing the single-anion conductor as a hole-injecting layer or the single-cation conductor as an electron-injecting layer. However, the organic/polymer EL devices can be prepared to include either the hole-injecting layer or the electron-injecting layer to optimize the EL intensity and efficiency.

A preferred embodiment of the organic/polymer EL device of the present invention employing single-ion conductors is schematically depicted in FIG. 1. The organic/polymer EL device employing single-ion conductors comprises a hole-injecting layer (3) that is prepared by spin-coating of the single-anion conductor on the ITO layer prepared by depositing the semitransparent electrode material (2) on the transparent substrate (1); an emissive layer (4) prepared by spin-coating of the organic emissive material on the hole-injecting layer (3); an electron-injecting layer (5) prepared by spin-coating of the single-anion conductor on the emissive layer (4); and, a metal electrode prepared by a thermal evaporation method using the metal such as Al, Mg, Li, Ca, Au, Ag, Pt, Ni, Pb, Cu, Fe, or their alloys on the electron-injecting layer (5).

As described above, when single-ion conductors are used in multi-layer EL devices, the conductivity is greater than $1 \times 10^{-8}$ s/cm. The EL efficiency of the device is described in quantum efficiency (% photons/electrons), which indicates the number of photons per the number of electron injected in a limit of % probability. The EL external quantum efficiency (external quantum efficiency=externally emitted photons/injected electrons×100 (%)) determined was between 0.5 and 2% photons/electrons, and the turn-on voltage for the emission was as low as 1.8V.

The present invention is further illustrated by the following examples, which should not be taken to limit the scope of the invention.

EXAMPLE 1

Preparation of an Organic/polymer EL Device Employing a Single-cation Conductor as an Electron-injecting Layer A derivative of poly(para-phenylenevinylene), MEH-PPV (poly[2-methoxy-5-(2'-ethyl-hexyl)-p-phenylenevinylene]) was spin-coated on ITO substrate in 60 nm thickness as an EL material, and then a single-cation conductor with structural formula (I) below, which has $Na^+$ as a counter ion by ionic bond formation, was spin-coated in 15 nm thickness on the MEH-PPV layer. After that, an aluminum electrode was deposited in 100 nm thickness by a thermal evaporation method to give an organic/polymer EL device. The EL intensity was measured using a photodiode (818-UV) connected to an optical powermeter (Newport 1830-C) after applying a forward bias electric field. When EL efficiency against current density of the organic/polymer EL device was calculated by measuring current while applying voltage using Keithley 236 Source measurement unit, the turn-on voltage for emission of the organic/polymer EL device was 1.8V.

Formula I

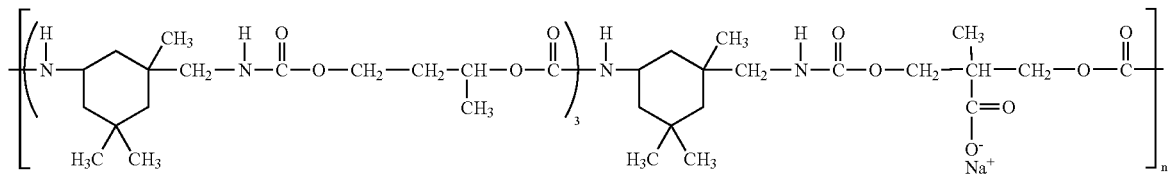

Comparative Example 1

Preparation of an Organic/polymer EL Device Without an Electron-injecting Layer An organic/polymer EL device without an electron-injecting in Example 1, except that the spin-coating of a single-cation conductor was omitted, and EL efficiency against current was calculated.

Comparative Example 2

Figure 2:
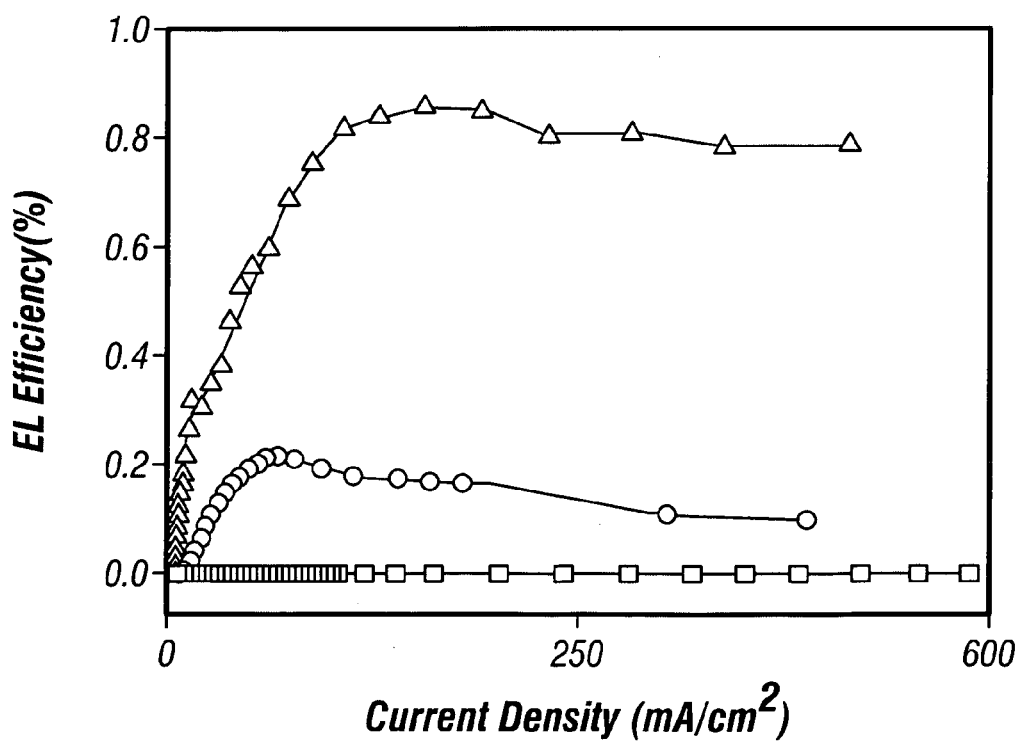
FIG. 2 is a graph showing the EL efficiency of an organic/polymer EL device employing a single-ion conductor as the electron-injecting layer, an organic/polymer EL device employing an ionomer as the electron-injecting layer, and an organic/polymer EL device without the electron-injecting layer.

Preparation of an Organic/polymer EL Device Employing an an Ionomer as an Electron-injecting Layer An organic/polymer EL device was fabricated in a similar manner as in Example 1, except that the known electron-injecting material, a SSPS ionomer (sodium sulfonated polystyrene) was used, and then EL efficiency against current was calculated to compared with the EL efficiencies in Example 1 and Comparative Example 1(see: FIG. 2). FIG. 2 depicts a graph comparing the EL efficiencies depending on the current densities of the organic/polymer EL devices in Example 1, Comparative Examples 1 and 2. In FIG. 2, (▲) represents the EL efficiency in case of employing a single-cation conductor as an electron-injecting layer, (●) represents the EL efficiency of the device employing an ionomer as an electron-injecting layer, and (■) represents the EL efficiency when the electron-injecting layer was not used.

As shown in FIG. 2, the EL efficiency of the invented organic/polymer EL device, employing a single-cation conductor as an electron-injecting layer, was improved by about 600 times as compared with that of not employing the electron-injecting layer, and by about 5 times compared with that of employing an ionomer as an electron-injecting layer. Further, the external quantum efficiency was calculated from the obtained results, for the invented organic/polymer EL device employing a single-cation conductor as an electron-injecting layer, which revealed that it was about 1% (photons/electrons), and for the organic/polymer EL device employing an ionomer as an electron-injecting layer, about 0.2% (photons/electrons), and for the organic/polymer EL device without the electron-injecting layer, about 0.004% (photons/electrons), which demonstrated that the organic/polymer EL device of the present invention is highly improved in terms of the EL efficiency by employing a single-cation conductor as an electron-injecting layer.

EXAMPLE 2

Preparation of an Organic/polymer EL Device Employing a Single-anion Conductor as a Hole-injecting Layer (1)

A single-anion conductor with the structural formula (II) below was spin-coated in 15 nm thickness on the ITO anode substrate followed by spin-coating of the EL material, MEH-PPV in 100 nm thickness. And then, an aluminum cathode was deposited in 100 nm thickness by a thermal evaporation method to give an organic/polymer EL device. When the EL device was activated by applying a forward electric field, the turn-on voltage for emission of the organic/polymer EL device was 1.8V.

Formula II

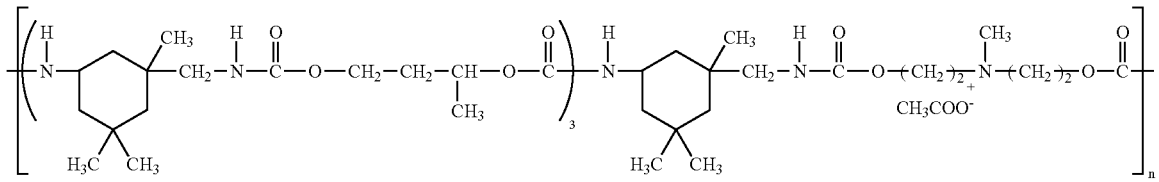

EXAMPLE 3

Preparation of an Organic/polymer EL Device Employing a Single-anion Conductor as an Hole-Injecting Layer (2)

An EL material, MEH-PPV was spin-coated on the ITO cathode substrate in 100 nm thickness followed by spin-coating of a single-anion conductor with the structural formula (II) above 15 nm in thickness. And then, an aluminum anode was deposited in 100 nm thickness by a thermal evaporation method to give an organic/polymer EL device. When the EL device was activated by applying reverse electric field, the turn-on voltage for emission of the organic/polymer EL device was 1.8V.

EXAMPLE 4

Preparation of an Organic/polymer EL Device Employing a Single-Anion Conductor as a Hole-injecting Layer and a Single-cation Conductor as an Electron-injecting Layer A single-anion conductor with the structural formula (II) above was spin-coated in 15 nm thickness on the ITO substrate followed by spin-coating of the EL material, MEH-PPV in 100 nm thickness. After the single-cation conductor with structural formula (I) was spin-coated in 15 nm thickness on the emissive layer, an aluminum electrode was deposited in 100 nm thickness by a thermal evaporation method to give an organic/polymer EL device. The EL intensity was measured while activating the EL device by applying forward electric fields. The turn-on voltage for emission of the organic/polymer EL device was 1.8V.

As clearly described and demonstrated as above, the present invention provides organic/polymer EL devices employing single-ion conductors as an electron- or hole-injecting layer. The organic/polymer EL device of the invention is improved in a sense that it employs an electron- or hole-injecting layer made of single-ion conductors in the EL device which comprises: a transparent substrate; a semitransparent electrode deposited on the transparent substrate; a hole-injecting layer positioned on the semitransparent electrode; an emissive layer made of an organic emissive material, positioned on the hole-injecting layer; an electron-injecting layer positioned on the emissive layer; and, a metal electrode deposited on the electron-injecting layer. The organic/polymer EL devices of the invention have excellent EL efficiency and low turn-on voltage, which make possible their application to the development of high efficiency organic/polymer EL devices.

Although the preferred embodiments of present invention have been disclosed for illustrative purpose, those who are skilled in the art will appreciate that various modifications, additions, and substitutions are possible, without departing from the spirit and scope of the invention as disclosed in the accompanying claims.

What is claimed is:

1. An electroluminescent device comprising:
   a substrate;
   a first electrode deposited on the substrate;
   a hole-injecting layer positioned on the first electrode, the hole-injecting layer comprising a polymeric compound and a movable anion, the polymeric compound having at least one block of $[O-(CH_2)_x]_y$ units and at least one non-movable cationic moiety, wherein x is an integer equal to or greater than two, wherein y is an integer equal to or greater than one;
   an emissive layer comprising an organic electroluminescent material, positioned on the hole-injecting layer;
   an electron-injecting layer positioned on the emissive layer, the electron-injecting layer comprising a polymeric compound and a movable cation, the polymeric compound having at least one block of $[O-(CH_2)_{x'}]_{y'}$ units and at least one non-movable anionic moiety, wherein x' is an integer equal to or greater than two, wherein y' is an integer equal to or greater than one; and
   a second electrode deposited on the electron-injecting layer.

2. An electroluminescent device comprising:
   a substrate;
   a first electrode deposited on the substrate;
   an electron-injecting layer positioned on the first electrode, the electron-injecting layer comprising a polymeric compound and a movable cation, the polymeric compound having at least one block of $[O-(CH_2)_{x'}]_{y'}$ units and at least one non-movable anionic moiety, wherein x' is an integer equal to or greater than two, wherein y' is an integer equal to or greater than one;
   an emissive layer comprising an organic electroluminescent material, positioned on the electron-injecting layer;
   a hole-injecting layer positioned on the emissive layer, the hole-injecting layer comprising a polymeric compound and a movable anion, the polymeric compound having at least one block of $[O-(CH_2)_x]_y$ units and at least one non-movable cationic moiety, wherein x is an integer equal to or greater than two, wherein y is an integer equal to or greater than one; and
   a second electrode deposited on the hole-injecting layer.

3. An electroluminescent device comprising:
   a substrate;
   a first electrode deposited on the substrate;
   a hole-injecting layer positioned on the first electrode, the hole-injecting layer comprising a polymeric compound and a movable anion, the polymeric compound having at least one block of $[O-(CH_2)_x]_y$ units and at least one non-movable cationic moiety, wherein x is an integer equal to or greater than two, wherein y is an integer equal to or greater than one;
   an emissive layer comprising an organic electroluminescent material, positioned on the hole-injecting layer; and,
   a second electrode deposited on the emissive layer.

4. The electroluminescent device of claim 3, wherein the substrate comprises a material selected from the group consisting of glass, quartz, and polyethylene terephthalate.

5. The electroluminescent device of claim 3, wherein the first electrode comprises a material selected from the group consisting of lead oxide, indium tin oxide, doped polyaniline, doped polypyrrole, doped polythiophene, and polyethylene dioxythiophene.

6. The electroluminescent device of claim 3, wherein the emissive layer comprises a material selected from the group consisting of emissive conjugated polymer, emissive non-conjugated polymer, emissive monomeric or oligomeric material, poly(meta-methylacrylic acid), poly(styrene), and poly(9-vinylcarbazole).

7. The electroluminescent device of claim 6, wherein the emissive conjugated polymer is selected from the group consisting of poly(p-phenylene vinylene), poly(thiophene), poly(p-phenylene), poly(fluorene), poly(arylenes), poly(arylene vinylene), polyquinoline, polypyrrole, polyaniline, polyacetylene, and derivatives thereof.

8. The electroluminescent device of claim 6, wherein the emissive non-conjugated polymer is a polymer having non-conjugated main chains and side chains substituted with emissive functional groups.

9. The electroluminescent device of claim 6, wherein the emissive monomeric or oligomeric material is selected from the group consisting of alumina quinone, rubrene, anthracene, perylene, coumarine 6, Nile red, aromatic diamine, N,N'-diphenyl-N,N'-bis-(3-methylphenyl)-1,1'-biphenyl-4,4'-diamine), (3-(4-biphenyl)-4-phenyl-5-(4-tert-butylphenyl)-1,2,4-triazole), (dicyanomethylene)-2-methyl-6-(p-dimethylaminostyryl)-4-H-pyran), and derivatives thereof.

10. The electroluminescent device of claim 3, wherein the second electrode comprises a material selected from the group consisting of aluminum, magnesium, lithium, calcium, copper, silver, iron, platinum, indium, palladium, tungsten, zinc, gold, lead, and alloys thereof.

11. The electroluminescent device of claim 3, wherein the polymeric compound is represented by one or more formulas selected from the group consisting of the formula (III) and formula (IV),

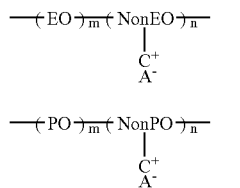

wherein EO represents ethylene oxide; NonEO represents non-ethylene oxide; PO represents propylene oxide; NonPO represents non-propylene oxide; $A^-$ represents an anion; $C^+$ represents a cation; m+n=1; and n represents a number more than 0 and less than 1.

12. The electroluminescent device of claim 3, wherein the polymeric compound is represented by one or more formulas selected from the group consisting of the formula (I) and the formula (II),

wherein EO represents ethylene oxide; NonEO represents non-ethylene oxide; PO represents propylene oxide; NonPO represents non-propylene oxide; $A^-$ represents an anion; $C^+$ represents a cation; m+n=1; and n is a number more than 0 less than 1.

13. The electroluminescent device of claim 3, wherein the polymeric compound comprises one or more segments selected from the group consisting of:

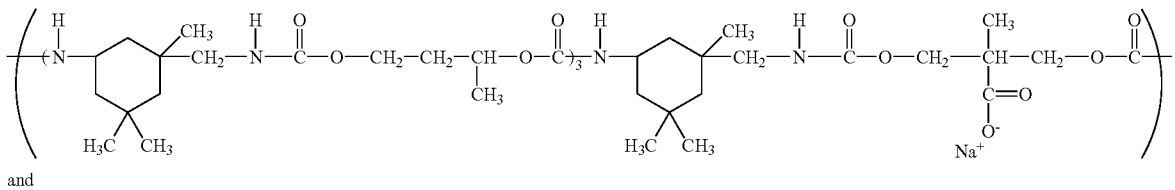

and

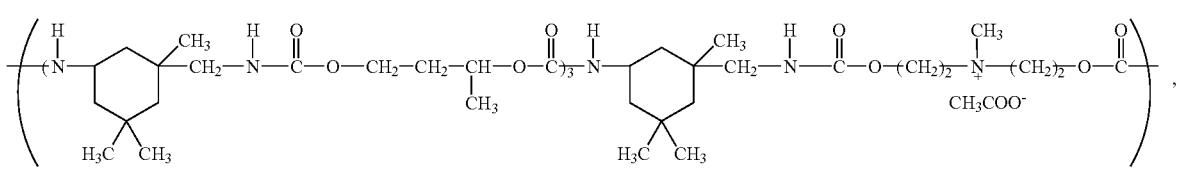

wherein $Na^+$ and $CH_3COO^-$ are movable ions.

14. An electroluminescent device comprising:
a substrate;
a first electrode deposited on the substrate;
an emissive layer comprising an organic electroluminescent material, positioned on the first electrode;
a hole-injecting layer positioned on the emissive layer, the hole-injecting layer comprising a polymeric compound and a movable anion, the polymeric compound having at least one block of $[O-(CH_2)_x]_y$ units and at least one non-movable cationic moiety, wherein x is an integer equal to or greater than two, wherein y is an integer equal to or greater than one; and
a second electrode deposited on the hole-injecting layer.

* * * * *